(12) United States Patent
Takechi et al.

(10) Patent No.: US 9,163,982 B2
(45) Date of Patent: Oct. 20, 2015

(54) OPTICAL RECEIVER DEVICE

(75) Inventors: Masaru Takechi, Kanagawa (JP);
Sousaku Sawada, Kanagawa (JP);
Yoshihiro Tateiwa, Kanagawa (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1045 days.

(21) Appl. No.: 13/093,283

(22) Filed: Apr. 25, 2011

(65) Prior Publication Data
US 2011/0215225 A1 Sep. 8, 2011

(30) Foreign Application Priority Data

Mar. 4, 2010 (JP) .................................. 2010-048386

(51) Int. Cl.
*H03F 3/08* (2006.01)
*G01J 1/44* (2006.01)
*G01J 1/46* (2006.01)

(52) U.S. Cl.
CPC .... *G01J 1/44* (2013.01); *G01J 1/46* (2013.01); *H03F 3/08* (2013.01); *H01L 2224/48091* (2013.01); *H01L 2924/1305* (2013.01); *H01L 2924/3011* (2013.01); *H01L 2924/30107* (2013.01)

(58) Field of Classification Search
CPC ................. G01J 1/44; G01J 1/46; H03F 3/08; H03F 3/087; H04B 10/60
USPC .................................... 398/202, 208; 330/252
See application file for complete search history.

(56) References Cited

U.S. PATENT DOCUMENTS

| 7,501,661 B2 * | 3/2009 | Iguchi et al. ..................... 257/82 |
| 2004/0188793 A1 * | 9/2004 | Lindemann et al. .......... 257/457 |
| 2004/0264980 A1 * | 12/2004 | Baek et al. ..................... 398/202 |
| 2007/0269167 A1 * | 11/2007 | Tamura et al. .................. 385/89 |

(Continued)

FOREIGN PATENT DOCUMENTS

| CN | 101340244 A | 1/2009 |
| JP | 63-114429 A | 5/1988 |

(Continued)

OTHER PUBLICATIONS

Japanese Office Action dated Feb. 4, 2014, issued in corresponding Japanese Patent Application No. 2010-048386 with English translation (6 pages).

(Continued)

*Primary Examiner* — Georgia Y Epps
*Assistant Examiner* — Kevin Wyatt
(74) *Attorney, Agent, or Firm* — Westerman, Hattori, Daniels & Adrian, LLP

(57) ABSTRACT

An optical receiver device including: a light-receiving element having a first electrode acting as an outputting electrode and a second electrode coupled to a potential that is different from a ground potential; an amplifier device having an amplifier element, a connection terminal including a signal electrode and a ground electrode on an upper face thereof; a first conductor coupling a potential of the first electrode of the light-receiving element to the signal electrode, the first conductor being introduced from the upper face side of the amplifier device; and a second conductor coupling a potential of the second electrode of the light-receiving element to the ground electrode, the second conductor introduced from the upper face side of the amplifier device.

11 Claims, 9 Drawing Sheets

(56) References Cited

U.S. PATENT DOCUMENTS

| | | | |
|---|---|---|---|
| 2008/0210849 A1* | 9/2008 | Sherazi et al. | 250/214 R |
| 2009/0080897 A1* | 3/2009 | Shiozaki et al. | 398/139 |
| 2010/0028023 A1* | 2/2010 | Ohta | 398/213 |
| 2011/0001204 A1* | 1/2011 | Nagarajan et al. | 257/432 |

FOREIGN PATENT DOCUMENTS

| | | |
|---|---|---|
| JP | 2-239674 A | 9/1990 |
| JP | 7-153987 A | 6/1995 |
| JP | 2004-128250 A | 4/2004 |
| JP | 2007-274032 A | 10/2007 |
| JP | 2007-305731 A | 11/2007 |
| JP | 2009-152436 A | 7/2009 |

OTHER PUBLICATIONS

Cited in Chinese Office Action dated Aug. 14, 2014, issued in corresponding Chinese Patent Application No. 201110105787.4; w/English Translation (11 pages).

* cited by examiner

OPTICAL RECEIVER DEVICE

BACKGROUND (i) Technical Field

The present invention relates to an optical receiver device.

(ii) Related Art

There is a demand for improvement of high frequency characteristics of an optical receiver device. Japanese Patent Application Publication No. 2007-274032 discloses an example of an optical receiver device. FIG. 1 illustrates an example of a circuit structure of an optical receiver device. As illustrated in FIG. 1, the optical receiver device has a light-receiving element 10, a TIA (Trans Impedance Amplifier) 20 and so on. A signal light 1 is optically coupled to the light-receiving element 10. An anode of the light-receiving element 10 is coupled to an input terminal of the TIA 20. A cathode of the light-receiving element 10 is coupled to a positive power supply (for example, 5V). The TIA 20 has an amplifier element 21 and a feedback resister R1. The light-receiving element 10 converts a light signal into an electrical signal. The TIA 20 converts the electrical signal current into voltage and outputs the signal voltage.

There is an increasing need of high frequency characteristics for an optical receiver device year by year.

SUMMARY

It is an object of the present invention to provide an optical receiver device of which high frequency characteristics are improved.

According to an aspect of the present invention, there is provided an optical receiver device comprising: a light-receiving element having a first electrode acting as an outputting electrode and a second electrode coupled to a potential that is different from a ground potential; an amplifier device having an amplifier element, a connection terminal including a signal electrode and a ground electrode on an upper face thereof; a first conductor coupling a potential of the first electrode of the light-receiving element to the signal electrode, the first conductor being introduced from the upper face side of the amplifier device; and a second conductor coupling a potential of the second electrode of the light-receiving element to the ground electrode, the second conductor introduced from the upper face side of the amplifier device.

In the optical receiver device, the potential different from the ground potential is coupled to the light-receiving element, and the light-receiving element is subjected to a reverse bias. However, the power supply potential acts as a reference potential in view of high frequency wave with respect to the outputting terminal (the first electrode) of the light-receiving element. The present inventors have researched the point. In the present invention, the electrode (the second electrode) coupled to the power supply applying the reverse bias is coupled to the ground electrode structuring a connection terminal of the amplifier device via a capacitor from the upper face of the amplifier device. With the structure, the transmission characteristics between the light-receiving element and the amplifier device may be improved. Therefore, the high frequency characteristics of the optical receiver device may be improved.

The ground electrode may be provided on both sides of the signal electrode.

The light-receiving element may have a structure in which two light-receiving portions are coupled in a cascade coupling configuration; the first electrode may be a common coupled point of the two light-receiving portions; and the second electrode may be at least one of electrodes of the two light-receiving portions in an opposite side of the common coupled point.

The light-receiving element may be mounted on a light-receiving element carrier having a first pattern extracting a potential of the first electrode and a second pattern extracting a potential of the second electrode.

The second pattern may be provided on both sides of the first pattern; and the first capacitor may be provided on both sides of the second pattern.

The first conductor may be a bonding wire coupling the first pattern and the signal electrode; and the second conductor may be a bonding wire coupling the first capacitor on the second pattern and the ground electrode.

The electrodes in the opposite side of the common coupled point may be coupled to a potential that is different from the ground potential.

The electrodes in the opposite side of the common coupled point may be coupled in common via a direct-current-blocking portion.

The direct-current-blocking portion may be the first capacitor.

A second capacitor having a capacity larger than that of the first capacitor may be coupled to a potential of the second electrode in parallel with the first capacitor.

DETAILED DESCRIPTION

A description will be given of an optical receiver device in accordance with a first comparative embodiment.

[First Comparative Embodiment]

Figure 2A:
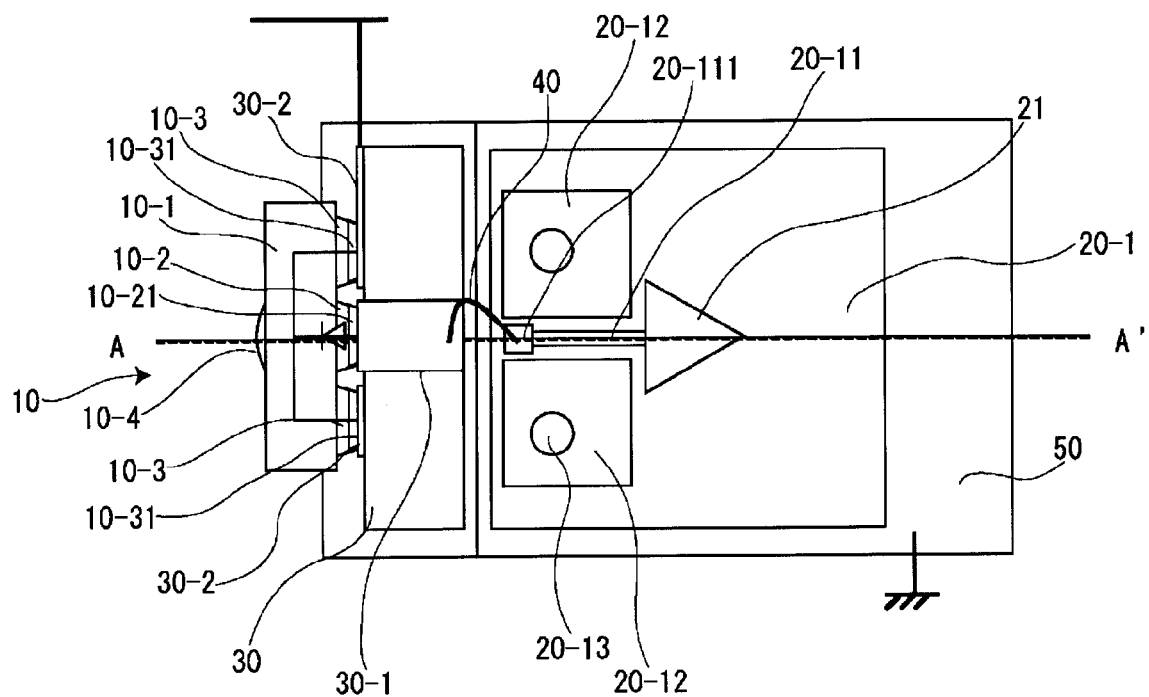
FIG. 2A illustrates a top view of an optical receiver device.
Figure 2B:
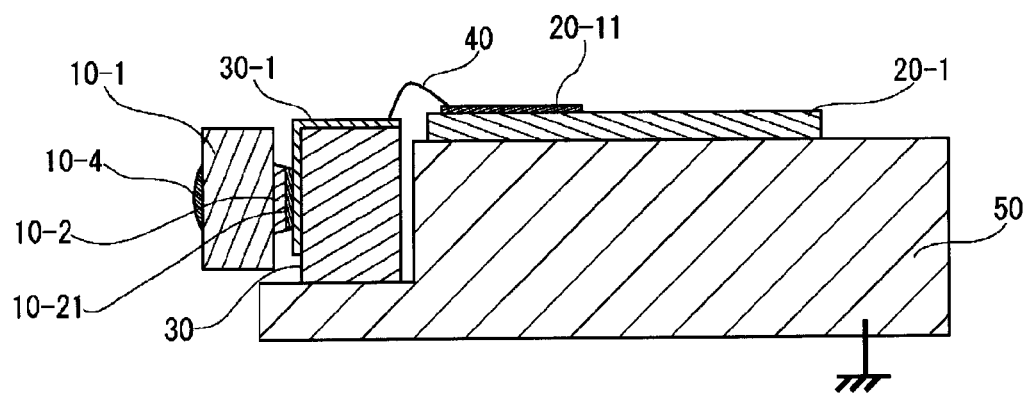
FIG. 2B illustrates a partial cross sectional view taken along a line A-A' of FIG. 2A.

FIG. 2A and FIG. 2B illustrate a schematic view of an optical receiver device in accordance with the first comparative embodiment. FIG. 2A illustrates a top view of the optical receiver device. FIG. 2B illustrates a partial cross sectional view taken along a line A-A' of FIG. 2A.

A light-receiving element 10 has a light-receiving element mesa 10-2 (a light receiving portion) provided on a main face of a semiconductor substrate 10-1, a dummy mesas 10-3 provided on both sides of the light-receiving mesa 10-2, and a lens 10-4 provided on a reverse face of the semiconductor substrate 10-1. FIG. 2A illustrates a circuit diagram of the light-receiving mesa 10-2 and the dummy mesas 10-3.

An upper face of the light-receiving element mesa 10-2 is made of p-type semiconductor. An outputting electrode 10-21 acting as an anode electrode is provided on the upper face of the light-receiving element mesa 10-2. A power supply electrode 10-31 acting as a cathode electrode is provided on an upper face of each dummy mesa 10-3. The power supply electrode 10-31 is introduced from an area of an n-type semiconductor that is a lower part of the light-receiving element mesa 10-2. The lens 10-4 collects an incoming signal light and provides the collected signal light into the light-receiving element mesa 10-2.

The light-receiving element 10 is mounted on the light-receiving element carrier 30. The light-receiving element carrier 30 is made of a dielectric body such as ceramics. A signal pattern 30-1 and a power supply pattern 30-2 are provided on a surface of the light-receiving element carrier 30. The signal pattern 30-1 is coupled to the outputting electrode 10-21 of the light-receiving element mesa 10-2. The power supply pattern 30-2 is coupled to the power supply electrode 10-31 of each dummy mesa 10-3. The power supply pattern 30-2 is coupled to a positive power supply. Thus, the light-receiving element 10 is subjected to a reverse bias through the power supply pattern 30-2.

Figure 1:
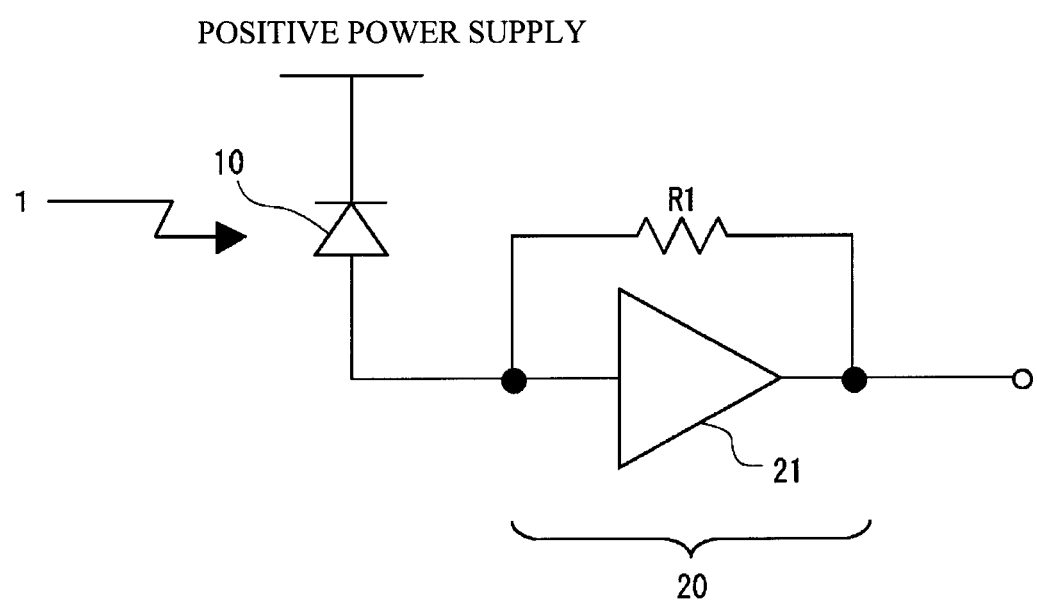
FIG. 1 illustrates an example of a circuit diagram of an optical receiver device.

On the other hand, the TIA 20 of FIG. 1 includes a TIA chip 20-1 made of semiconductor. The TIA chip 20-1 has an amplifier element 21 illustrated schematically. The TIA chip 20-1 has a feedback resister, a power supply circuit and so on. A signal conductor 20-11 is coupled to an input terminal of the amplifier element 21. The signal conductor 20-11 has a signal electrode 20-111. A ground electrode 20-12 is provided on both sides of the signal conductor 20-11 and the signal electrode 20-111. The ground electrode 20-12 is coupled to a ground potential of the reverse face via a via hole electrode 20-13. The signal electrode 20-111 and the ground electrode 20-12 act as an input terminal having given characteristics impedance.

The light-receiving element carrier 30 and the TIA chip 20-1 are mounted on a base carrier 50. The base carrier 50 is made of a conductor and is coupled to a ground potential. The ground potential is coupled to the ground electrode 20-12 via a via hole electrode 20-13 of the TIA chip 20-1. A bonding wire 40 couples the signal pattern 30-1 provided on the light-receiving element carrier 30 and the signal electrode 20-111 provided on the TIA chip 20-1.

There is an increasing need of high frequency characteristics for an optical receiver device year by year. For example, downsizing the light-receiving element mesa 10-2 and reducing a parasitic capacity may improve the high frequency characteristics of the light-receiving element 10. However, when the light-receiving element mesa 10-2 is further downsized, an optical coupling may not be obtained in a light-receiving area of the light-receiving element mesa 10-2. An optical receiver device in accordance with the following embodiments improves the high frequency characteristics.

[First Embodiment]

Figure 3A:
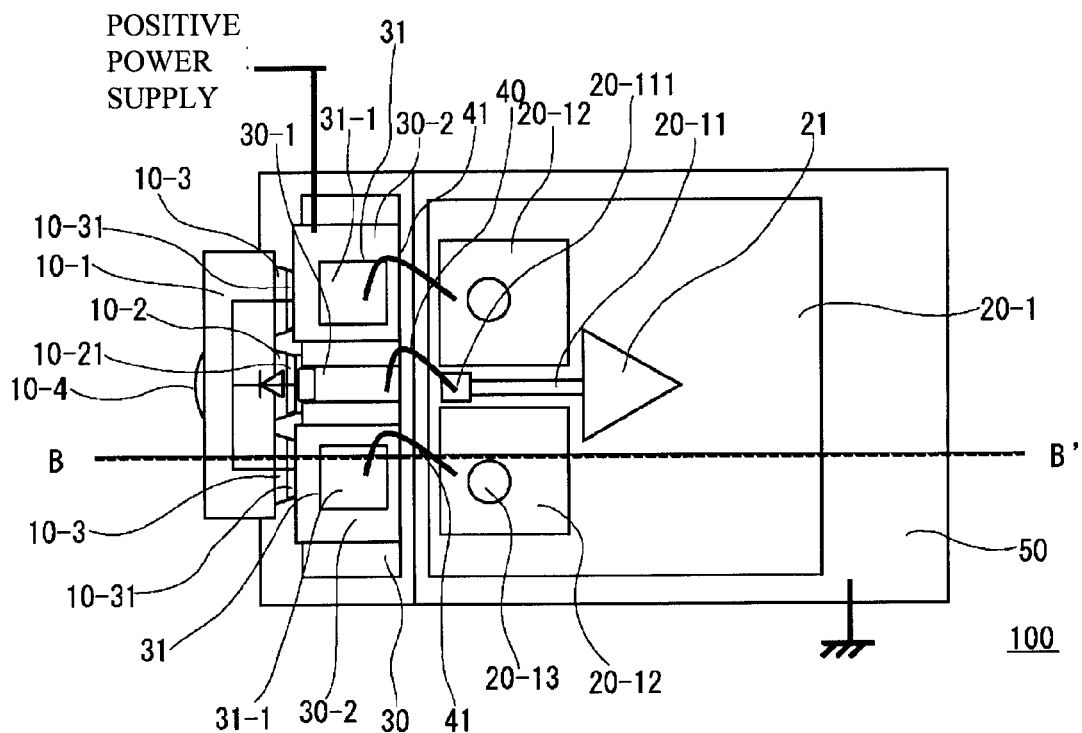
FIG. 3A illustrates a top view of an optical receiver device in accordance with a first embodiment.
Figure 3B:
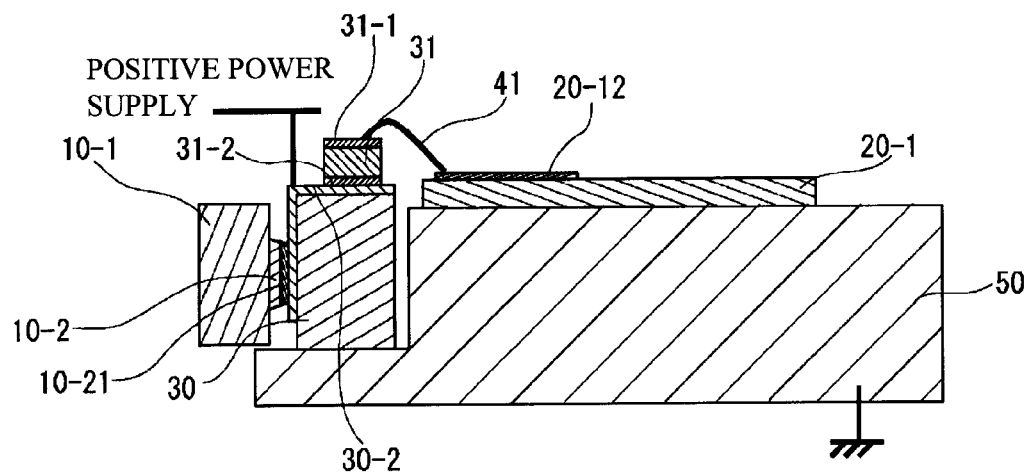
FIG. 3B illustrates a partial cross sectional view taken along a line B-B' of FIG. 3A.

FIG. 3A and FIG. 3B illustrate an optical receiver device 100 in accordance with a first embodiment. FIG. 3A illustrates a top view of the optical receiver device 100. FIG. 3B illustrates a partial cross sectional view taken along a line B-B' of FIG. 3A. In the first embodiment, the present invention is applied to an optical receiver device adopting the light-receiving element 10 illustrated in FIG. 2.

In FIG. 3A and FIG. 3B, the light-receiving element 10 has the same structure as that of FIG. 2A and FIG. 2B. The light-receiving element 10 has the light-receiving element mesa 10-2 and the dummy mesas 10-3 provided on the main face of the semiconductor substrate 10-1. In addition, FIG. 3A illustrates a circuit diagram of the light-receiving element mesa 10-2 and the dummy mesas 10-3.

The light-receiving element mesa 10-2 has a light-receiving element structure of p-i-n type. For example, the semiconductor substrate 10-1 is made of InP. And, the p-i-n structure of the light-receiving mesa 10-2 has a structure in which n-type InP, i-type (or n-type) InGaAs, and p-type InGaAs are laminated in order from the substrate side. In the embodiment, an upper face of the light-receiving element mesa 10-2 acts as an anode terminal, and a lower face (the substrate side) of the light-receiving element mesa 10-2 acts as a cathode terminal. The outputting electrode 10-21 acting an outputting terminal of the light-receiving element 10 (and acting as a first electrode) is provided on the upper face of the light-receiving element mesa 10-2.

The dummy mesa 10-3 is provided on both sides of the light-receiving element mesa 10-2. The power supply electrode 10-31 (acting as a second electrode) is provided on an upper face of each dummy mesa 10-3. The dummy mesa 10-3 is not electrically used. The dummy mesa 10-3 extracts a potential of the cathode terminal of the light-receiving element mesa 10-2 to the same height as the light-receiving element mesa 10-2. In the embodiment, a positive potential (for example, 5V) is coupled to the power supply electrode 10-31. Thus, the light-receiving element 10 is subjected to a reverse bias.

The lens 10-4 is provided on the reverse face of the semiconductor substrate 10-1. The lens 10-4 collects an incoming light and provides the collected light into the light-receiving element mesa 10-2. The light-receiving element carrier 30 is made of a dielectric body such as ceramics. The signal pattern 30-1 is provided on the light-receiving element carrier 30 according to the outputting electrode 10-21 provided on the light-receiving element mesa 10-2 of the light-receiving element 10. The power supply pattern 30-2 is provided on both sides of the signal pattern 30-1 according to the power supply electrode 10-31 provided on each dummy mesa 10-3. The two power supply patterns 30-2 are coupled to in common in an area on the light-receiving element carrier 30, and are coupled to a positive power supply. A distance between the signal pattern 30-1 and the power supply pattern 30-2 is determined so as to form a transmission line having given characteristics impedance.

The signal pattern 30-1 and the power supply pattern 30-2 are provided on a face having a right angle with the face on which the light-receiving element 10 of the light-receiving element carrier 30 is mounted. The two power supply patterns 30-2 of the light-receiving element carrier 30 respectively have a capacitor 31 acting as a first capacitor thereon. The capacitor 31 has an upper face electrode 31-1 and a lower face electrode 31-2. The lower face electrode 31-2 is coupled to the power supply pattern 30-2 in common.

On the other hand, the TIA chip 20-1 acting as an amplifier device is, for example, made of InP. The TIA chip 20-1 has the amplifier element 21 including a HBT (Hetero Junction Bipolar Transistor). The signal conductor 20-11 is coupled to an input terminal of the amplifier element 21. The signal electrode 20-111 is provided on an edge of the signal conductor 20-11. The ground electrode 20-12 is provided on both sides of the signal conductor 20-11 and the signal electrode 20-111.

The via hole electrode 20-13 is provided on the ground electrode 20-12, and is coupled to a reverse face electrode provided on a reverse face of the TIA chip 20-1. The signal electrode 20-11 and the ground electrode 20-12 act as an input terminal having given impedance. The signal conductor 20-11 and the ground electrode 20-12 couple the input terminal (the signal electrode 20-111 and the ground electrode 20-12) and the amplifier element 21, and form a transmission line having given characteristics impedance.

The TIA chip 20-1 and the light-receiving element carrier 30 mounting the light-receiving element 10 are mounted on the base carrier 50 made of a conductor such as copper tungsten (CuW) or iron-nickel-cobalt (FeNiCo). The base carrier 50 is coupled to a ground potential and gives the ground potential to the reverse face electrode of the TIA chip 20-1.

A bonding wire 40 (acting as a first coupling conductor) couples the signal pattern 30-1 provided on the light-receiving element carrier 30 and the signal electrode 20-111 coupled to the signal conductor 20-11 of the TIA chip 20-1. A bonding wire 41 (acting as a second coupling conductor) couples the upper face electrode 31-1 of the capacitor 31 mounted on each power supply pattern 30-2 and each ground electrode 20-12 of the TIA chip 20-1.

With the structure, an electrode (in the embodiment, the power supply electrode 10-31 of the light-receiving element 10) coupled to the power supply applying a reverse bias to the light-receiving element 10 is coupled to the ground electrode 20-12 on the TIA chip 20-1 in common in view of high frequency wave.

In accordance with the embodiment, a commonality between a reference potential of the light-receiving element 10 (the power supply electrode 10-31 of the light-receiving element 10) and the ground electrode 20-12 on the TIA chip 20-1 is improved in view of high frequency wave. This allows an improvement of transmission characteristics of a signal path from the light-receiving element 10 to the TIA chip 20-1. Unnecessary inductance is restrained because the coupling is established with the bonding wires 40 and 41 on the upper face side that is a side where the signal conductor 20-11 of the TIA chip 20-1 is provided.

With the structure, the high frequency characteristics of the optical receiver device 100 are improved. In the embodiment, a reverse bias is applied to the light-receiving element 10 by coupling a positive power supply to the cathode terminal. However, the structure is not limited to the embodiment. For example, the reverse bias may be applied as well as the light-receiving element 10 by applying a negative bias to the anode terminal.

[Second Embodiment]

Figure 4:
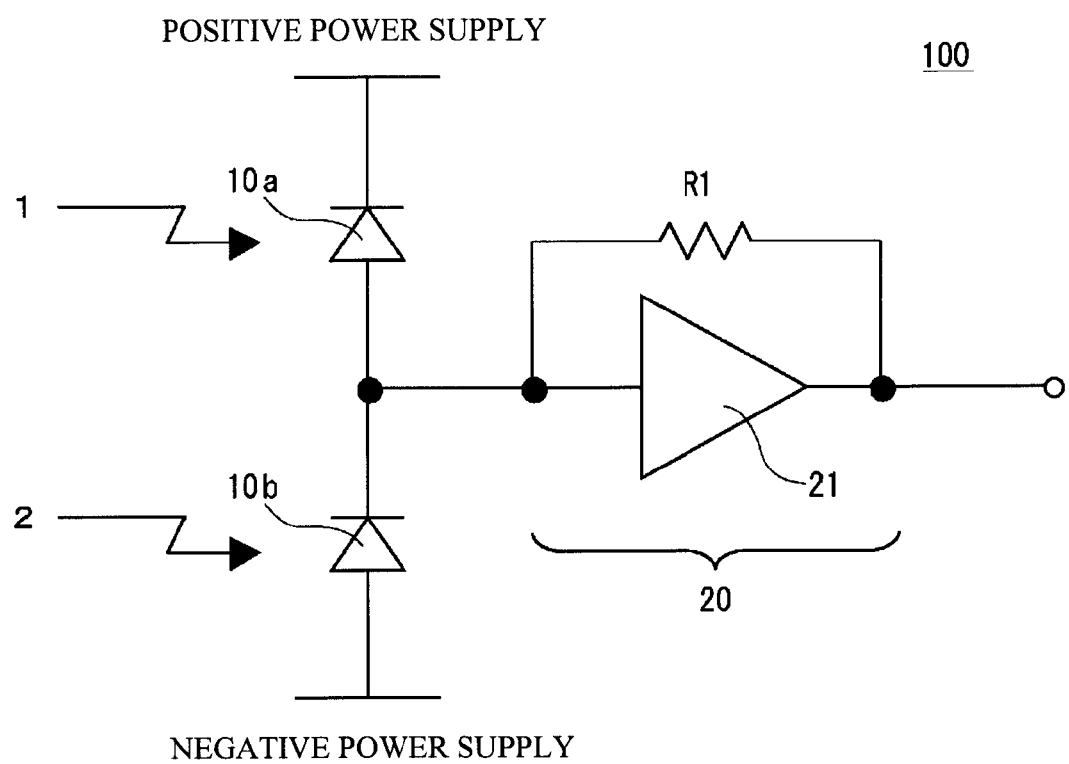
FIG. 4 illustrates a circuit diagram of an optical receiver device in accordance with a second embodiment.

Next, a description will be given of a second embodiment. The second embodiment adopts an optical receiver device using a light-receiving element of balance type. FIG. 4 illustrates a circuit structure of an optical receiver device 101 in accordance with the second embodiment.

As illustrated in FIG. 4, in the optical receiver device 101, a light-receiving element 10a and a light-receiving element 10b are coupled to each other with a cascade coupling configuration in a single direction. An output signal is extracted from a common coupled point of the two light-receiving elements 10a and 10b. The other ends of the two light-receiving elements 10a and 10b are coupled to the power supply applying a reverse bias thereto. In FIG. 4, the other end of the light-receiving element 10a is coupled to the positive power supply, and the other end of the light-receiving element 10b is coupled to the negative power supply.

The output signal extracted from the common coupled point is fed into the TIA 20. The TIA 20 converts the output signal into a voltage signal. Optical signals 1 and 2 having reverse phase are optically coupled to the two light-receiving elements 10a and 10b respectively. Thus, signal amplitude from the light-receiving elements 10a and 10b can be enlarged. The embodiment is specifically preferable in a photoelectric conversion of a digital optical signal that is phase-modulated.

Figure 5:
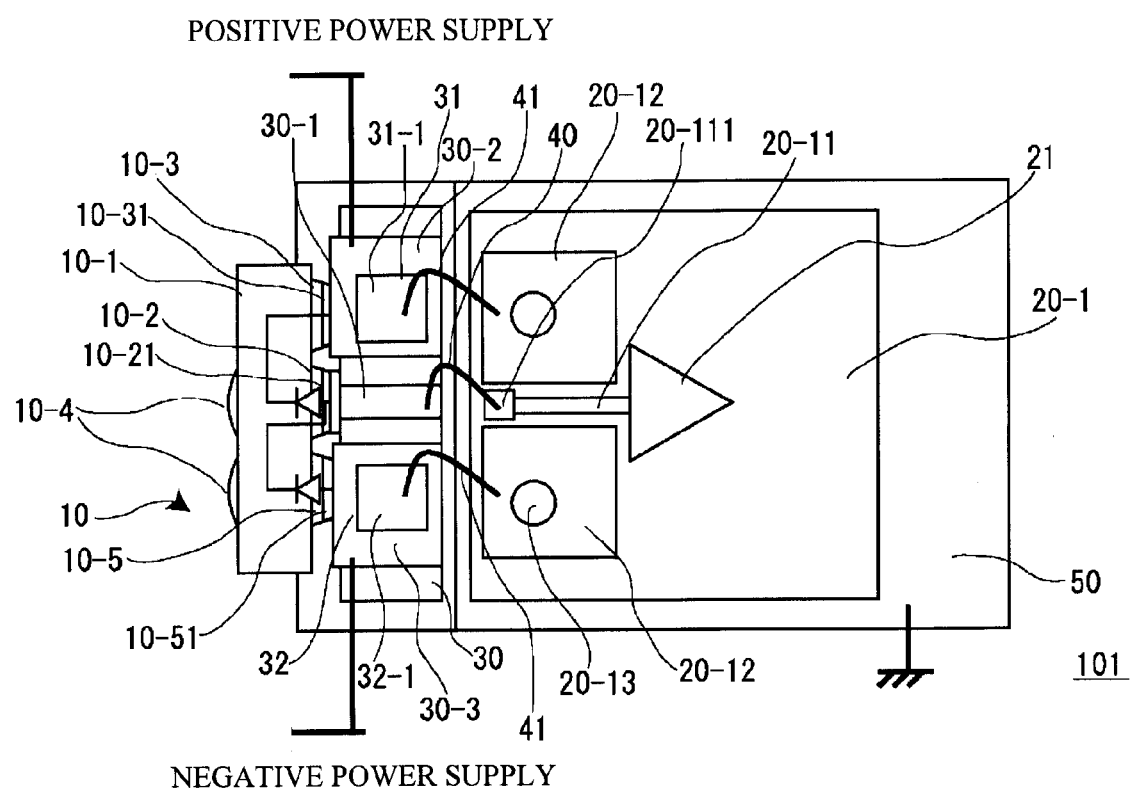
FIG. 5 illustrates a top view of the optical receiver device in accordance with the second embodiment.

FIG. 5 illustrates a top view of the optical receiver device 101. The same components as those illustrated in FIG. 5 have the same reference numerals as the first embodiment. The light-receiving element 10 has light receiving element mesas 10-2 and 10-5 acting as the two light-receiving elements 10a and 10b structuring a balance type light-receiving element on the main face of the semiconductor substrate 10-1. The dummy mesa 10-3 is arranged to be adjacent to the light-receiving element mesa 10-2. The light-receiving element mesa 10-2 and the light-receiving element mesa 10-5 are coupled to each other with a cascade configuration. FIG. 5 illustrates a circuit diagram of the light-receiving element mesas 10-2 and 10-5 and the dummy mesa 10-3.

The upper face of the light-receiving element mesa 10-2 acts as a common coupled point of two light-receiving portions. The outputting electrode 10-21 acting as an output terminal of a balance type light-receiving element is provided on the upper face of the light-receiving element mesa 10-2. A negative power supply electrode 10-51 coupled to the negative power supply for applying a reverse bias to the light-receiving element mesa 10-5 is provided on the upper face of the light-receiving element mesa 10-5. A positive power supply electrode 10-31 coupled to the positive power supply for applying a reverse bias to the light-receiving element mesa 10-2 is provided on the upper face of the dummy mesa 10-3. That is, the positive power supply electrode 10-31 and the negative power supply electrode 10-51 act as an electrode for applying electrical power (a second electrode). The positive power supply electrode 10-31 and the negative power supply electrode 10-51 have a reference potential with respect to the signal electrode 10-21 in view of high frequency wave. The lens 10-4 is provided on the reverse face of the semiconductor substrate 10-1 according to the light-receiving element mesas 10-2 and 10-5.

The power supply patterns 30-2 and 30-3 are provided on both sides of the signal pattern 30-1 on the light-receiving element carrier 30. The power supply pattern 30-2 is electrically isolated from the power supply pattern 30-3. The power supply pattern 30-2 is coupled to the positive power supply electrode 10-31 of the dummy mesa 10-3, and is coupled to outer positive power supply. The power supply pattern 30-3 is coupled to the negative power supply electrode 10-51 of the light-receiving element mesa 10-5, and is coupled to outer negative power supply.

The capacitor 31 is mounted on the power supply pattern 30-2. The capacitor 32 is mounted on the power supply pattern 30-3. A lower face electrode of the capacitors 31 is coupled to the power supply pattern 30-2. A lower face electrode of the capacitors 32 is coupled to the power supply pattern 30-3. The upper face electrodes 31-1 and 32-1 of the capacitors 31 and 32 are respectively coupled to each ground electrode 20-12 via a bonding wire.

In the embodiment, one of the two ground electrodes 20-12 of the TIA chip 20-1 is coupled to the power supply pattern 30-2 coupled to the positive power supply via the capacitor 31. The other is coupled to the power supply electrode 30-3 coupled to the negative power supply via the capacitor 32.

In the embodiment, transmission characteristics of a signal path from the light-receiving element 10 to the TIA chip 20-1 is improved as well as the first embodiment. Although the balance type light-receiving element is coupled between the positive power supply and the negative power supply in the embodiment, the light-receiving element may be coupled between the positive power supply and the ground potential.

In this case, the negative power supply electrode 10-51 of the light-receiving element mesa 10-5 is coupled to the ground potential via the power supply pattern 30-3. And, the capacitor 32 may be removed, and the power supply pattern 30-3 may be directly coupled to the ground electrode 20-12 via the bonding wire 41.

[Third Embodiment]

Next, a description will be given of a third embodiment. In the third embodiment, a bonding wire 42 couples the upper face electrodes 31-1 and 32-1 of the capacitors 31 and 32 in common. The other structure is the same as the second embodiment.

Figure 6:
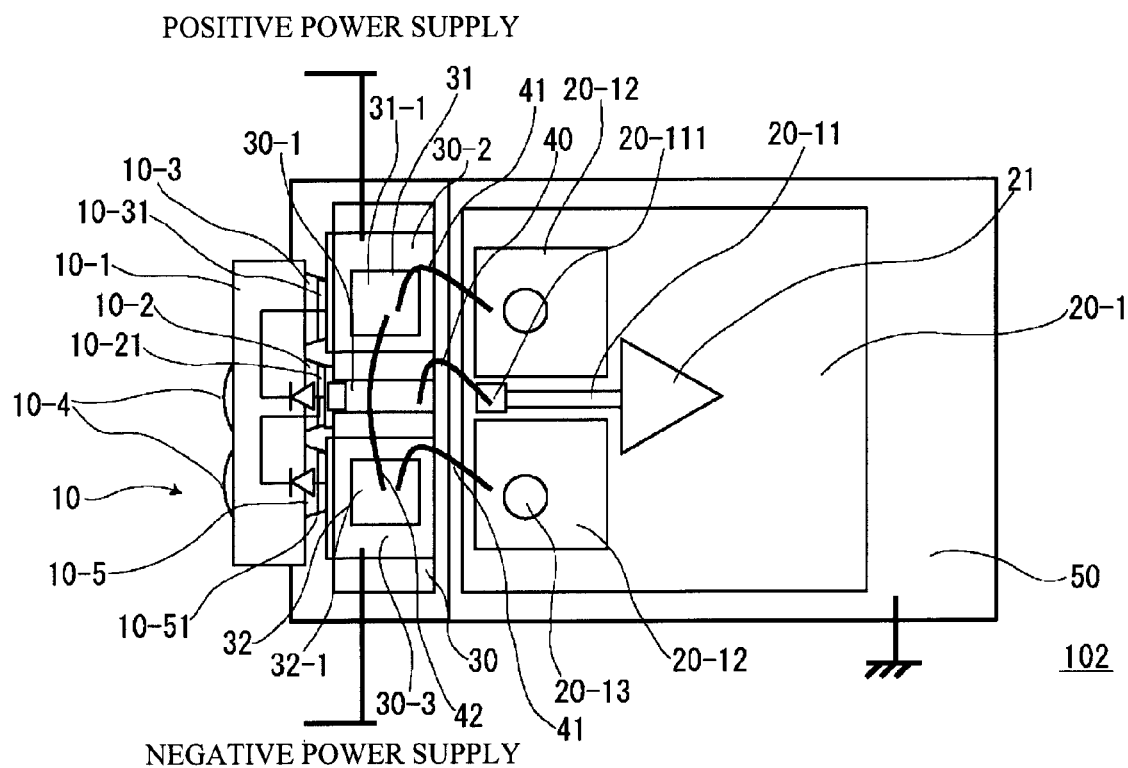
FIG. 6 illustrates a top view of an optical receiver device in accordance with a third embodiment.

FIG. 6 illustrates an optical receiver device 102 in accordance with the third embodiment. FIG. 6 illustrates a circuit diagram of the light-receiving element mesas 10-2 and 10-5 and the dummy mesa 10-3. In the optical receiver device 102, power supplies coupled to the balance type light-receiving element 10 are coupled in common via a direct-current-blocking portion. In the embodiment, the capacitors 31 and 32 are used as the direct-current-blocking portion. Another capacitor may be provided, and the potentials of the capacitors 31 and 32 may be coupled in common after blocking a direct current.

In accordance with the embodiment, two power supplies are coupled in common in the balance type light-receiving element 10 in view of high frequency wave. The two power supplies are coupled to the ground potential of the transmission path of the TIA chip 20-1 in common. With the structure, high frequency characteristics are further improved.

Figure 7:
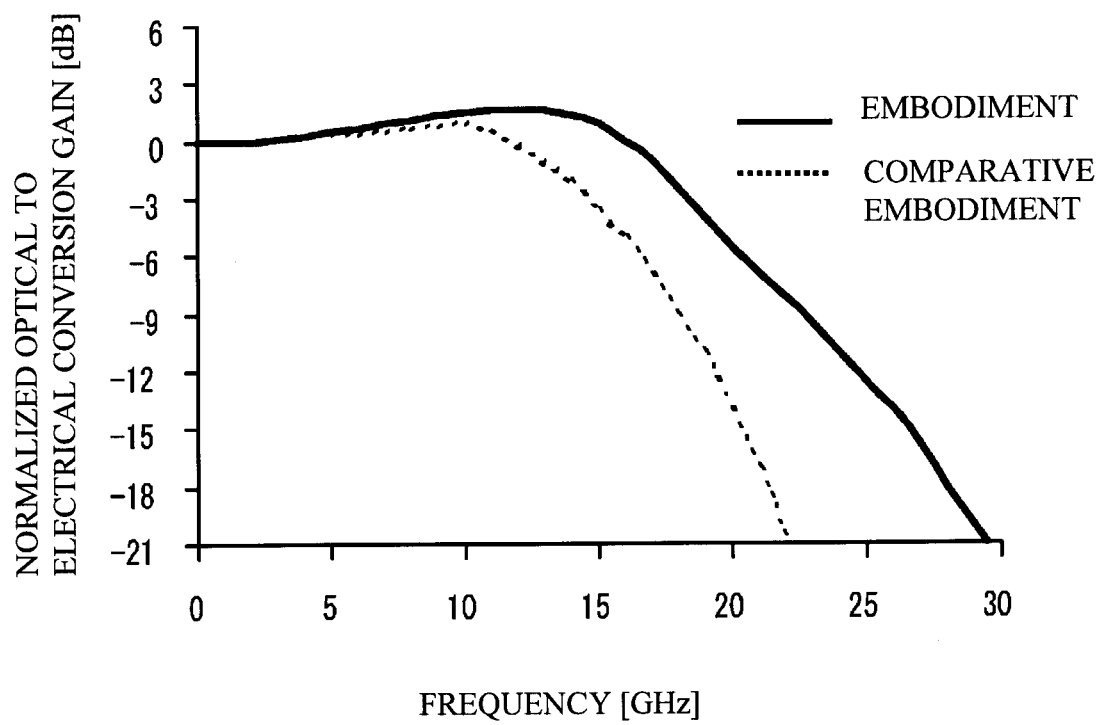
FIG. 7 illustrates frequency characteristics of photoelectric conversion gain of the optical receiver device in accordance with the third embodiment.

FIG. 7 illustrates frequency characteristics of a normalized optical to electrical conversion gain of the optical receiver device 102 in accordance with the third embodiment. In addition, FIG. 7 illustrates frequency characteristics of a second comparative embodiment. The second comparative embodiment has a structure in which the capacitors 31 and 32 and the bonding wires 41 and 42 are removed in FIG. 6. As illustrated in FIG. 7, 3 dB band width is approximately 16 GHz with respect to the second comparative embodiment. In contrast, 3 dB band width is near 20 GHz in the third embodiment. Therefore, FIG. 7 means that the high frequency characteristics are improved in the third embodiment.

[Fourth Embodiment]

Figure 8:
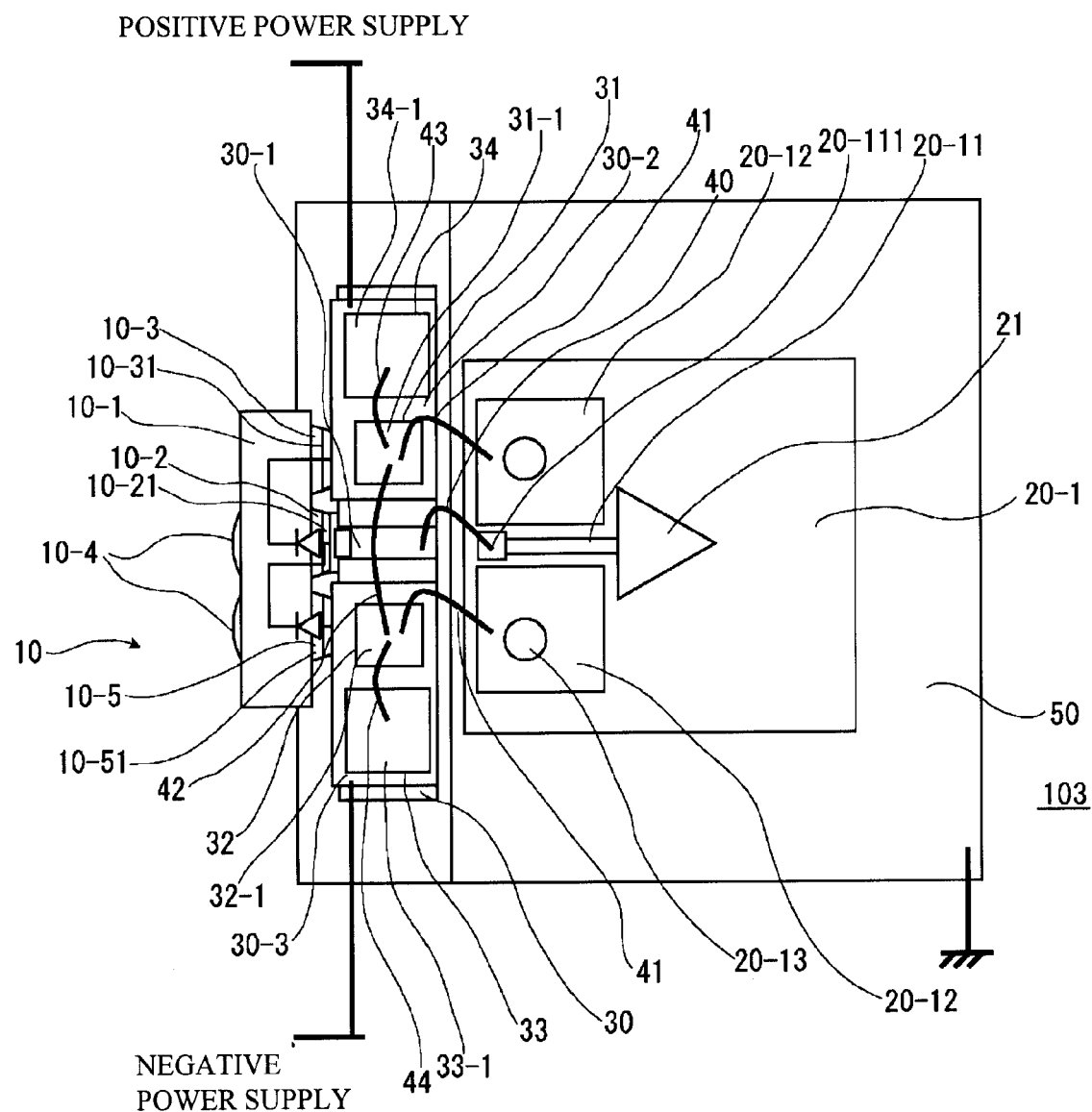
FIG. 8 illustrates a top view of an optical receiver device in accordance with a fourth embodiment.

Next, a description will be given of a fourth embodiment. FIG. 8 illustrates a top view of an optical receiver device 103 in accordance with the fourth embodiment. In the embodiment, capacitors 33 and 34 acting as a second capacitor are further provided on the light-receiving element carrier 30 in the structure of the third embodiment. FIG. 8 illustrates a circuit diagram of the light-receiving element mesas 10-2 and 10-5 and the dummy mesa 10-3.

The capacitors 33 and 34 have an upper face electrode and a lower face electrode as well as the capacitors 31 and 32 acting as a first capacitor. The lower face electrode of the capacitor 33 is coupled to the power supply electrode 30-2 on the light-receiving element carrier 30. The lower face electrode of the capacitor 34 is coupled to the power supply electrode 30-3 on the light-receiving element carrier 30. The upper face electrode 33-1 of the capacitor 33 is coupled to the upper face electrode 31-1 of the capacitor 31 via the bonding wire 43. The upper face electrode 34-1 of the capacitor 34 is coupled to the upper face electrode 32-1 of the capacitor 32 via the bonding wire 44. The capacitors 33 and 34 have a capacity larger than those of the capacitors 31 and 32, and have a pass frequency band lower than those of the capacitors 31 and 32. When the capacitors 33 and 34 are provided, the reference potential is commonalized with the ground electrode 20-12 in a wide frequency band. Therefore, the high frequency characteristics are further improved.

[Fifth Embodiment]

Figure 9:
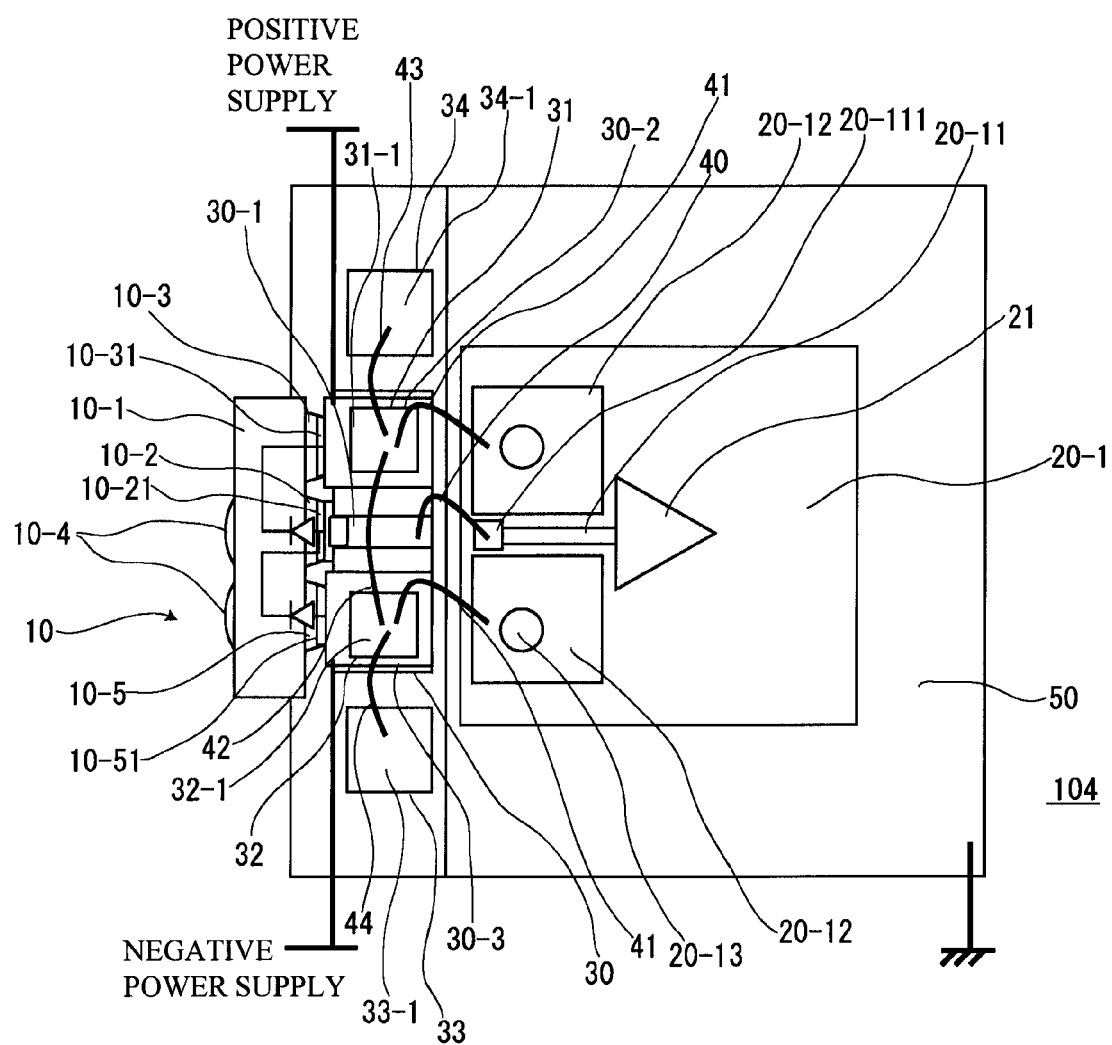
FIG. 9 illustrates a top view of an optical receiver device in accordance with a fifth embodiment.

A description will be given of a fifth embodiment. FIG. 9 illustrates a top view of an optical receiver device 104 in accordance with a fifth embodiment. In the optical receiver device 104, the capacitors 33 and 34 of the fourth embodiment are provided on the base carrier 50. FIG. 9 illustrates a circuit diagram of the light-receiving element mesas 10-2 and 10-5 and the dummy mesa 10-3.

The lower face electrodes of the capacitors 33 and 34 are coupled to the base carrier 50, and are thereby grounded. The upper face electrode 33-1 of the capacitor 33 is coupled to the upper face electrode of the capacitor 31, and the upper face electrode 34-1 of the capacitor 34 is coupled to the upper face electrode of the capacitor 32, as well as the fourth embodiment. In the embodiment, the potentials of the upper faces of the capacitors 31 and 32 are blocked by the capacitors 33 and 34 with respect to a direct current, and are coupled to the ground potential of the base carrier 50 in view of high frequency wave. The ground potential of the base carrier 50 is coupled to the ground potential of the ground electrode 20-12 of the TIA chip 20-1 via the via hole electrode 20-13. Thus, the upper face electrodes 31 and 32 are coupled to the ground electrode 20-12 via the base carrier 50 in common.

In the embodiment, the capacitors 33 and 34 are provided on the base carrier 50. Therefore, the mounting of the optical receiver device 104 is easier than that of the optical receiver device 103.

In the embodiment, the capacitors 33 and 34 are mounted on the base carrier 50. Therefore, the bonding wires 43 and 44 are longer than the case of the fourth embodiment. However, the capacitors 33 and 34 pass a frequency band lower than that of the capacitors 31 and 32. Therefore, the inductance of the longer bonding wires 43 and 44 does not have a large influence on the lower frequency band.

In accordance with the above-mentioned embodiments, an optical receiver device having improved high frequency characteristics is provided. The present invention is not limited to the embodiments. The light-receiving element 10 may be an APD (Avalanche Photodiode) using avalanche multiplication. The light-receiving element 10 may be mounted on the base carrier 50 although the light-receiving element 10 is mounted on the light-receiving element carrier 30 in the embodiments. In this case, the base carrier 50 may be made of dielectric body, and the signal pattern 30-1 and the power supply patterns 30-2 and 30-3 may be provided on the base carrier 50 as a pattern. The capacitors 31 and 32 may be mounted on the power supply patterns 30-2 and 30-3 provided on the base carrier 50.

The light-receiving element 10 may be mounted on the TIA chip 20-1. In this case, the signal pattern 30-1 and the power supply patterns 30-2 and 30-3 may be mounted on the TIA chip 20-1 as a pattern. The capacitors 31 and 32 may be provided on the TIA chip 20-1. Alternatively, the capacitors 31 and 32 may be made of MIM (Metal-Insulator-Metal) capacitor on the TIA chip 20-1.

In the first through third embodiments, a via hole electrode is provided in the ground electrode 20-12 of the TIA chip 20-1. However, the structure is not always necessary. In the embodiments, the reference potential for a signal transmission is coupled to the ground electrode 20-12 via the capacitors 31 and 32 from the light-receiving element 10. Therefore, the ground electrode 20-12 is grounded in view of high frequency wave even if the ground electrode 20-12 of the TIA chip 20-1 is not coupled to the ground potential of the TIA chip 20-1.

A balance type light-receiving element may be used, and an optical signal that is phase-modulated may be converted into an electrical signal. A plurality of the optical receiver devices may be used as a light-receiving unit for DP-QPSK (Dual Polarization-Quadrature Phase Shift Keying) optical communication.

In the second through fifth embodiments, two light-receiving portions (the light-receiving element mesas 10-2 and 10-5) are integrated on a common semiconductor substrate as the balance type light-receiving element 10. However, the structure is not limited to the embodiments. For example, the balance type light receiving element may have a structure in which separated light receiving elements chips may be coupled in a cascade coupling configuration.

The present invention is not limited to the specifically disclosed embodiments and variations but may include other embodiments and variations without departing from the scope of the present invention.

What is claimed is:

1. An optical receiver device comprising:
    a light-receiving element having a first electrode acting as an outputting electrode and a second electrode coupled to a potential that is different from a ground potential;
    an amplifier device having an amplifier element, a connection terminal including a signal electrode and a ground electrode on an upper face thereof;
    a first conductor coupling a potential of the first electrode of the light-receiving element to the signal electrode, the first conductor being introduced from the upper face side of the amplifier device; and
    a second conductor coupling a potential of the second electrode of the light-receiving element to the ground electrode via a first capacitor, the second conductor introduced from the upper face side of the amplifier device, wherein
    the light-receiving element is mounted on a light-receiving element carrier, the first capacitor is mounted on a face of the light-receiving element carrier that is different from a face of the light-receiving element carrier on which the light-receiving element is mounted, and the light-receiving element carrier and the amplifier device are mounted on a base carrier.

2. The optical receiver device as claimed in claim 1, wherein the ground electrode is provided on both sides of the signal electrode.

3. The optical receiver device as claimed in claim 1, wherein:
    the light-receiving element has a structure in which two light-receiving portions are coupled in a cascade coupling configuration;
    the first electrode is a common coupled point of the two light-receiving portions; and
    the second electrode is at least one of electrodes of the two light-receiving portions in an opposite side of the common coupled point.

4. The optical receiver device as claimed in claim 1, wherein the light-receiving element is mounted on the light-receiving element carrier having a first pattern extracting a potential of the first electrode and a second pattern extracting a potential of the second electrode.

5. The optical receiver device as claimed in claim 4, wherein:
    the second pattern is provided on both sides of the first pattern; and
    the first capacitor is provided on both sides of the second pattern.

6. The optical receiver device as claimed in claim 4, wherein:
    the first conductor is a bonding wire coupling the first pattern and the signal electrode; and
    the second conductor is a bonding wire coupling the first capacitor on the second pattern and the ground electrode.

7. The optical receiver device as claimed in claim 3, wherein the electrodes in the opposite side of the common coupled point are coupled to a potential that is different from the ground potential.

8. The optical receiver device as claimed in claim 3, wherein the electrodes in the opposite side of the common coupled point are coupled in common via a direct-current-blocking portion.

9. The optical receiver device as claimed in claim 8, wherein the direct-current-blocking portion is the first capacitor.

10. The optical receiver device as claimed in claim 1, wherein a second capacitor having a capacity larger than that of the first capacitor is coupled to a potential of the second electrode in parallel with the first capacitor.

11. The optical receiver device as claimed in claim 1, wherein the face of the light-receiving element carrier on which the first capacitor is mounted faces a same direction as the face of the base carrier on which the amplifier device is mounted.

* * * * *